United States Patent

Borden et al.

[15] 3,647,444

[45] *Mar. 7, 1972

[54] LITHOGRAPHIC PRINTING PLATE PREPARED FROM LINEAR LIGHT-SENSITIVE POLYMERS CONTAINING THE STYRYL KETONE GROUP

[72] Inventors: Douglas G. Borden; Cornelius C. Unruh; Stewart H. Merrill, all of Rochester, N.Y.

[73] Assignee: Eastman Kodak Company, Rochester, N.Y.

[ * ] Notice: The portion of the term of this patent subsequent to July 1, 1986, has been disclaimed.

[22] Filed: Nov. 15, 1968

[21] Appl. No.: 776,263

Related U.S. Application Data

[63] Continuation-in-part of Ser. No. 828,455, July 21, 1959, Pat. No. 3,453,237.

[52] U.S. Cl. ....................96/33, 96/35.1, 96/115 R, 96/85, 96/86 P, 96/87 R

[51] Int. Cl.....................G03c 1/68, G03f 7/02

[58] Field of Search....................96/115, 33, 35.1, 85, 86, 87

[56] References Cited

UNITED STATES PATENTS

| | | | |
|---|---|---|---|
| 2,728,745 | 12/1955 | Smith et al. | 96/115 X |
| 3,030,208 | 4/1962 | Schellenberg et al | 96/35 |
| 3,043,802 | 7/1962 | Thoma et al. | 96/115 X |
| 3,453,237 | 7/1969 | Borden et al. | 96/86 X |

*Primary Examiner*—Ronald H. Smith
*Attorney*—William H. J. Kline, James R. Frederick and Joshua G. Levitt

[57] ABSTRACT

Photosensitive elements are described which are useful for preparing lithographic printing plates and which employ, as the light-sensitive component, polyesters, including polycarbonates, which contain the styryl ketone group as an integral part of the polymer backbone.

18 Claims, No Drawings

LITHOGRAPHIC PRINTING PLATE PREPARED FROM LINEAR LIGHT-SENSITIVE POLYMERS CONTAINING THE STYRYL KETONE GROUP

This is a continuation-in-part of Borden et al. U.S. application Ser. No. 828,455, filed July 21, 1959, now U.S. Pat. No. 3,453,237.

This invention relates to lithography, more particularly to lithographic printing plates having thereon a light-sensitive resin.

Lithographic printing plates having a support with an oleophilic image layer thereon are well known. It is also well known to have the printing plates prepared by exposing a light-sensitive layer on a support whereby the light establishes a solubility differential so that an image may be obtained which is either oleophilic or can be made oleophilic. Typical of such plate materials are, for example, metal supports such as aluminum, copper, zinc, etc., polymeric supports such as polystyrene, polyester, polyamide, etc., paper supports including those having various coatings thereon to improve the dimensional stability, hydrophilic surface, wearability, etc. The ink receptive image may be applied mechanically or may be supplied by having thereon a light-sensitive polymer, a light-sensitive diazonium compound, etc.

The known light radiation sensitive media used in preparing lithographic plates have various disadvantages, such as inadequate keeping properties, relatively low sensitivity to light, low degree of ink receptivity, weak adherence to the support after processing, difficulty in processing, poor wearability on the press, etc.

Accordingly, there has been a need for a lithographic printing plate which would have the advantages of relative simplicity in preparation, but which would have acceptable light sensitivity, good stability, and the like.

We have discovered a new light-sensitive polymeric material which can be used alone or in admixture with certain other materials for the preparation of lithographic printing plates.

It is one object of this invention to provide lithographic printing plate material which has improved stability during storage, improved light sensitivity and superior press life.

Another object is to provide a radiation-sensitive resin which can be admixed with other materials to form a satisfactory image-forming media for use in lithography.

A still further object is to provide a polymeric material which is soluble in organic solvents but which becomes insoluble when exposed to radiations.

Another object is to provide lithographic printing plates having various supports which can be prepared as presensitized lithographic printing plates.

The above objects are attained by employing as the light-sensitive component in a photosensitive element a radiation sensitive polymer containing recurring styryl ketone groups, typically of the structural formula:

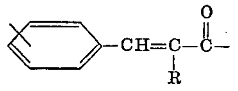

as an integral part of the polymer backbone; R being hydrogen or a hydrocarbon group. The polymer is mixed with a suitable solvent and coated on a lithographic support. The radiation sensitive coating is then imagewise exposed to actinic radiation to insolubilize the polymer in exposed areas, and the unexposed areas are removed after which the remaining image can be used for printing.

The polymers employed are those described in the above-mentioned copending Borden et al. U.S. application Ser. No. 828,455. In general these polymers are derived from the interaction of light-sensitive bisphenols and certain reactive chloride compounds. For purposes of discussion the polymers can be divided into three groups. More specifically, the polymers of group I are polycarbonates obtained by the reaction of a light-sensitive bisphenol, containing a styryl ketone group in its structure, with phosgene as the reactive chloride compound. Mixtures of one or more bisphenols containing styryl ketone groups or mixtures of at least one bisphenol containing a styryl ketone group and one or more nonlight-sensitive bisphenols may also be employed. The polymers of group II are polyesters obtained by the reaction of a bisphenol containing a styryl ketone group with a reactive chloride compound such as a di-acid chloride of an aliphatic, alicyclic or aromatic di-carboxylic acid, or the chlorides of certain sulfur- or phosphorus-containing acids. As above, mixtures of light-sensitive and nonlight-sensitive bisphenols may be employed and if desired, mixtures of the acid chlorides may also be used. The polymers of group III like those of group I are polycarbonates and are obtained by reacting a bisphenol reactant of the type described above with a bischloroformate as the reactive chloride compound. Representative light-sensitive polymers from each of these three groups and typical methods of preparing these polymers are illustrated by the following formulas and equations:

GROUP I

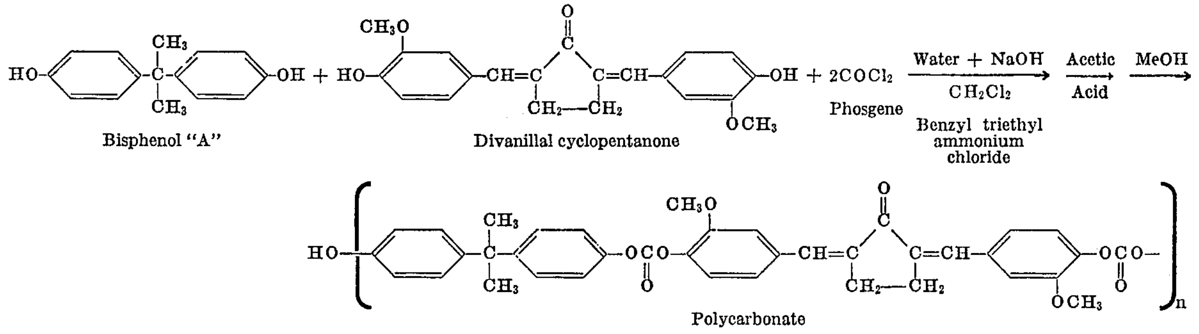

GROUP II

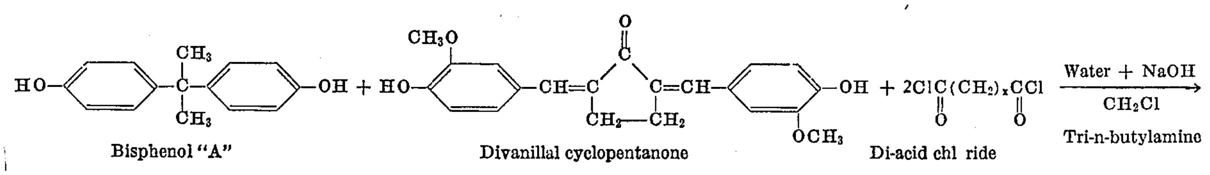

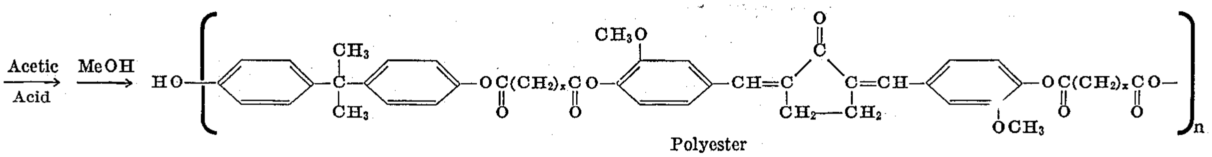

Polyester

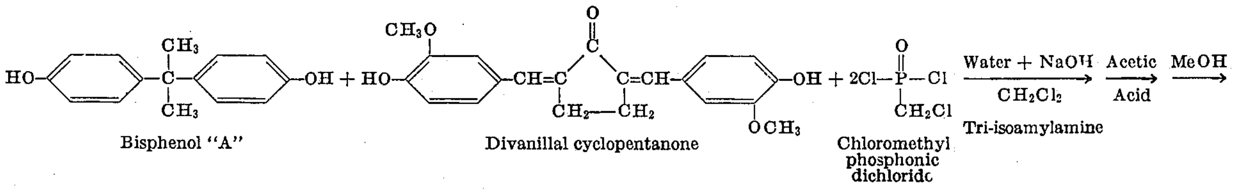

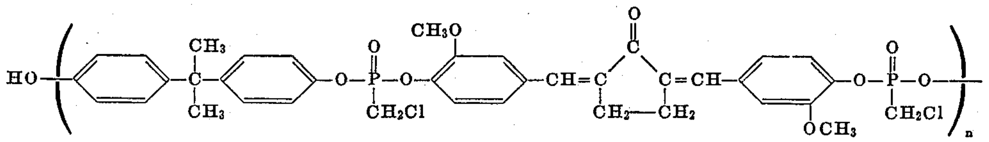
Polyphosphonate

Pyridine is then quaternized with the above phosphonate and the quaternary salt is precipitated in diethyl ether.

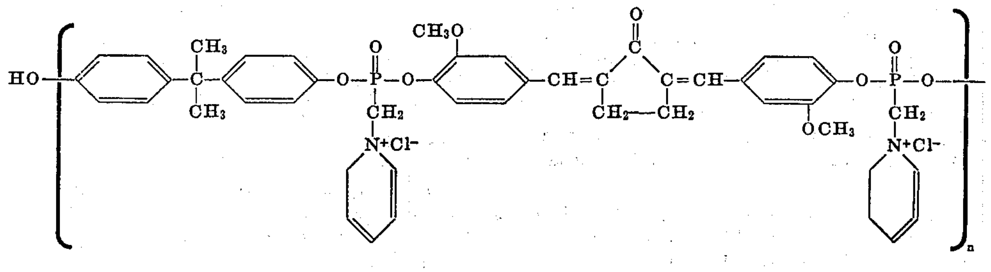

GROUP III

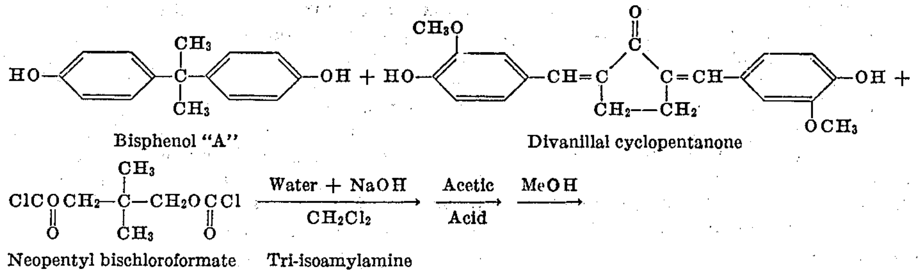

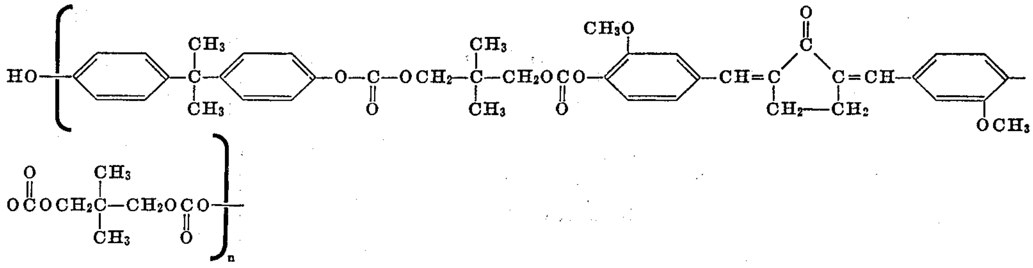

In the formulas above, $x$ is a whole number from 1 to about 8 and $n$ is a number sufficiently large to ensure a film-forming or resinous polymer and in most cases is at least 5; polymers in which $n$ is greater than 5, i.e., 10–30 or higher are particularly useful.

In general, the polymers of groups I, II and III are prepared by allowing a bisphenol to react with the appropriate reactive chloride in the presence of a suitable catalyst in a two-phase solvent system. The term "reactive chloride" as employed herein is intended to include acid dichlorides such as phosgene, di-acid chlorides of aliphatic or aromatic dicarboxylic acids, certain sulfur and phosphorus acid chlorides, and bischloroformates all of which are described in greater detail below. The bisphenol reactant and the catalyst, preferably a basic catalyst such as an amine, are normally dissolved in aqueous sodium hydroxide. The reactive chloride is customarily dissolved in a water-immiscible inert organic solvent such as dichloromethane. The two-phase reaction mixture is then stirred while the desired polymer is formed at the interface. Although the polymer solution usually attains a good viscosity after a few minutes, it has been found that the light sensitivity of the resulting polymer can be increased by prolonging the reaction time beyond this point. The condensation reaction is stopped when sufficiently complete by the addition of excess acetic acid. The desired polymer, present in the dichloromethane layer, is washed with water to remove salts and is then separated by precipitation with methanol.

Reaction times of about 50 to 100 minutes are generally sufficient at temperatures of about 3° to 25° C., although longer or shorter times and somewhat lower or higher temperatures may be employed with success in some instances. The optimum reaction conditions for the formation of the polymers of groups I, II and III vary with the specific reactants and catalysts employed as well as other factors. It has been found, however, that excellent high-viscosity polymers are generally obtained at reaction temperatures in the range from about 3° to 10° C.

It is preferred to employ from about 10 to 30 mole percent excess of the reactive chloride with respect to the bisphenol reactant since in many cases the use of stoichiometric quantities of the reagents results in incomplete reaction and low molecular weight polymers. This is probably due to the hydrolysis of the reactive chloride compounds in the aqueous phase of the reaction mixture. Such hydrolysis occurs to a greater extent with the diacid chlorides of dicarboxylic acids than with phosgene or the bischloroformates and is most pronounced with such reactive chlorides as the phosphonic dichlorides and thionyl chloride which may require the use of up to 100 mole percent excess reagent for best results.

Inasmuch as the polymers of groups I, II and III are formed at the interface of a two-phase system, it is advantageous to employ a catalyst which is also an effective surfactant. Quaternary salts such as benzyl triethyl ammonium chloride are suitable catalysts although less effective than the tri-alkylamines. Triethylamine, tri-n-butylamine and tri-isoamylamine are especially useful.

The acid dichlorides useful in the preparation of the polymers of the present invention include:

1. diacid chlorides of aliphatic, alicyclic and aromatic dicarboxylic acids. The preferred aliphatic and alicyclic diacids are those in which the alicyclic or aliphatic chain is a lower alkyl group containing from one to about eight carbon atoms. The preferred aromatic diacids are those of the benzene series. Specific diacid chlorides useful in the invention include adipyl chloride, fumaryl chloride, glutaryl chloride, oxalyl chloride, succinyl chloride, azelayl chloride, phthaloyl chloride, cis and trans 1,4-cyclohexanedicarbonyl chloride;
2. acid chlorides of phosphorus-containing acids such as chloromethyl phosphonic dichloride and dichlorophenyl phosphine oxide;
3. acid chlorides of sulfur-containing acids such as thionyl chloride; and
4. bischloroformates useful in the invention include those derived from aliphatic and alicyclic glycols, particularly those having from one to about 20 carbon atoms, among others. Specific bischloroformates which can be employed include: ethylene bischloroformate, diethylene bischloroformate, triethylene bischloroformate, 1,3-propanediol bischloroformate, 2-methyl-2-nitro-1,3-propanediol bischloroformate, 2-ethyl-2-isobutyl-1,3-propanediol bischloroformate, diisopropylene bischloroformate, pentamethylene bischloroformate, neopentyl bischloroformate, nonamethylene bischloroformate, decamethylene bischloroformate, tetradecamethylene bischloroformate, octadecamethylene bischloroformate, 2,2,4,4-tetramethyl-1,3-cyclobutylene bischloroformate, 2,4-dimethyl-2,4-dipropyl-1,3-cyclobutylene bischloroformate, cis-cyclododecylene-1,2-bischloroformate, 5-cis-9-trans-cyclododecylene-1,2-cis-bischloroformate, dispiro[5.1.5.1]tetradecylene-7,12-bischloroformate, 1,4-cyclohexanedimethanol bischloroformate, 1,3-cyclohexanedimethanol bischloroformate, 1,4-bis($\beta$-hydroxyethoxy)cyclohexane bischloroformate, ditetramethylenesuccinate bischloroformate, dinonamethyleneazelate bischloroformate, bis[2-(2-chloroformyloxy-ethylsulfonyl)ethyl]ether, and 1,2-bis[2-(chloroformyloxyethylsulfonyl)ethoxy]ethane.

A particularly useful class of reactive acid dichlorides are the bischloroformates having the structural formula:

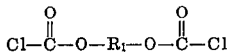

where $R_1$ is an alkylene group of one to 12 carbon atoms such as ethylene, propylene, diethylene, pentylene, neopentylene, nonylene, decylene, etc.

Light-sensitive bisphenol reactants, containing the styryl ketone group, useful in the invention include dihydroxy chalcones and dihydroxy dibenzal ketones such as:

4,4'-dihydroxy chalcone
2,6-bis(3-hydroxybenzal)cyclohexanone
2,6-bis(4-hydroxybenzal)cyclohexanone
di-m-hydroxybenzal acetone
divanillal acetone
divanillal cyclohexanone
divanillal 4-methylcyclohexanone
divanillal 4-t-butylcyclohexanone
divanillal cyclopentanone
di(nitrovanillal)cyclopentanone
divanillal cycloheptanone
divanillal cyclooctanone
disyringal cyclopentanone
disyringal acetone
disalicylal acetone
disalicylal cyclopentanone
1,5-bis(4-hydroxy-3-methoxyphenyl)-2-methyl-1,4-pentadiene-3-one A particularly useful class of light-sensitive bisphenol reactants have the structural formula:

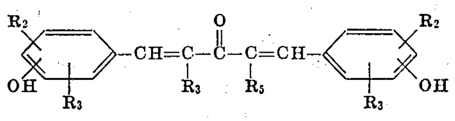

wherein $R_2$ and $R_3$ are each hydrogen atoms or methoxy groups and $R_4$ and $R_5$ are each a hydrogen atom or together represent the hydrocarbon radical necessary to complete a saturated ring of five to six carbon atoms.

As noted above, the bisphenol reactants can be employed singly or in mixtures in the preparation of the polymers of groups I, II and III. It has been found further that the incorporation of from about 5 to 95 percent by weight of certain nonlight-sensitive bisphenols in the bisphenol reactant mixture improves the solubility and molecular weight of the light-sensitive polymers derived therefrom. The ratio of light-sensitive bisphenol to nonlight-sensitive bisphenol can be varied at will within the range from about 5 to 95 mole percent light-sensitive to 95 to 5 mole percent nonlight-sensitive bisphenol depending upon the effect desired. With the polymers of group I it has been found that the use of from about 40 to 60 mole percent of nonlight-sensitive bisphenol produces the most useful polymers. With the group II polyesters and the group III polycarbonates, on the other hand, the most desirable compositions are obtained by the use of from about 10 to 30 mole percent of nonlight-sensitive bisphenol. Suitable nonlight-sensitive bisphenols include:

2,2-bis(4-hydroxyphenyl)propane [Bisphenol A]
2,2-bis(4-hydroxy-3,5-dichlorophenyl)propane [Tetrachloro Bisphenol A]
2,2-bis(4-hydroxy-3,5-dibromophenyl)propane [Tetrabromo Bisphenol A]
2,2-bis(4-hydroxy-3,5-diiodophenyl)propane [Tetraiodo Bisphenol A]
4,4'-dihydroxydiphenyl sulfone
alizarin
quinizarin
anthrarufin
4,8-di-p-toluidinoanthrarufin
1,4-diaminoanthraquinone
1,4-bis(p-hydroxyanilino)anthraquinone
dibenzoylresorcinol
4-phenylazoresorcinol
4'-nitro-4-phenylazoresorcinol
3'-nitro-4-phenylazoresorcinol
N,N-bis(p-hydroxybenzoyl)-p-phenylenediamine
p-xylylidene bis(p-hydroxyaniline)
salicylalazine
2,2'-dihydroxy-1,1'-naphthalazine
divanillalazine
4,4'-dihydroxy-3,3'-dimethoxy-5,5'-dinitrobenzalazine
N-[5-(2-benzo[b]thiazolylidene)-1-(3,4-dihydroxybenzoyl-penta-1,3-dienyl]pyridinium iodide
1-cyano-1-(3,4-dihydroxybenzoyl)-2-[julolidin-9-yl]ethane Particularly preferred nonlight-sensitive bisphenols are the quinizarin and alizarin dyes, 4,4'-dihydroxydiphenyl sulfone and Bisphenol A and its derivatives having the structural formula:

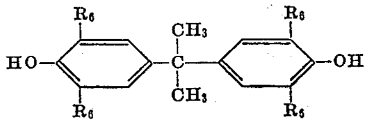

wherein $R_6$ is a hydrogen, chlorine or bromine atom.

It will be appreciated that the above structural formulas in groups I–III are illustrative, and that certain of the recurring groups do not necessarily occur in the order portrayed in the illustrative structures, but would occur in random positions. For instance, in group III, it will be noted that the Bisphenol A and the divanillal cyclopentanone are linked together by the neopentyl bischloroformate. However, there could be two recurring units of the Bisphenol A or more linked together by the chloroformate before a divanillal cyclopentanone unit occurs in the polymer chain; or in another structure, there might be two or more of the divanillal cyclopentanone structures in the chain before a Bisphenol A group occurs.

For many purposes, it is desirable that a visible image be obtained either during exposure or during processing of the exposed light-sensitive polycarbonate resin. This may be accomplished by incorporating a dye or pigment in the resin so that during processing, the exposed areas which remain after the unexposed areas are removed will carry the dye or pigment incorporated therein. It will be appreciated that the concentration of the dyes, pigments or other colored or color-forming material will vary widely depending upon the desired result.

The types of supports which are useful in carrying out our invention depend upon the desired result, such as cost of the lithographic plate and its intended use. For instance, for relatively short runs, it may be desirable to use a paper support. A particularly useful paper support is one having coated thereon a polymeric material which improves the dimensional stability, wearability and the like. Polymeric materials which may be used for coating paper for lithographic uses are well known in the lithographic field and include polyolefins, polyamides, polyesters, cellulose esters, polyvinyl materials including copolymers of styrene with other unsaturated materials such as butadiene, etc.

These coatings can be applied by solvent coating techniques as hot melt coatings or from latex mixtures by any of the known techniques for coating on paper. For some purposes, it is desirable to give the polymeric coating a special treatment to improve adhesion. Such treatments include electron bombardment, coating with a subbing which can contain certain solvents, colloidal silica, or the like in order to improve adhesion, oxidizing the surface by flame treatment and the like, etc.

A particularly useful method of obtaining a lithographic surface involves a separate coating which may be called a lithographic coating containing a polyvinyl alcohol and colloidal silica such as that described in U.S. Pat. No. 3,055,295.

Another useful hydrophilic layer suitable for use in planographic printing and related uses comprises a support having on the surface a layer formed in situ from an aqueous coating composition comprising an alkyl titanate and at least one solubilizing compound selected from the class consisting of fluosilicic acid, hydrofluoric acid, fluoboric acid, hydrogen peroxide and a mixture of hydrogen peroxide and phosphoric acid.

It will also be appreciated that the particular paper used as a support may be a matter of choice. However, unbleached brown kraft paper is durable and is very suitable when coated with polyethylene. Other supports such as metals include aluminum having various surface treatments including anodizing and the like, copper, zinc, so-called bimetal plates and the like. Various polymeric materials which are also known in the printing art for use in lithography may also be used. These include polymeric materials such as polystyrene, polyesters, polyamides, cellulose esters, polycarbonates, polyacetals, polyurethanes, etc.

Various coverages of the light-sensitive polymers can be used depending upon the intended use of the lithographic plates. For instance, a lighter coverage is desirable where a polymeric material on paper or similar support is used for the lithographic plate as compared to longer run plates having a metal support such as aluminum, aluminum foil, copper, zinc, etc. In general, the light-sensitive polymers are coated on the support at coverages ranging from approximately 5 to approximately 100 mg./sq.ft. A particularly useful range of coverage extends from about 20 to about 45 mg./sq.ft.

Exposure of the light-sensitive resins is advantageously obtained using ultraviolet light such as that supplied from a mercury arc lamp. However, our invention includes the use of other light sources, particularly when the light-sensitive polymer has been sensitized by the addition of spectral or chemical sensitizing agents to increase the sensitivity range, speed, etc.

Processing of the exposed light-sensitive materials is carried out by using a solvent for the unexposed light-sensitive resin. Preferably, relatively nontoxic organic solvents are used, such as benzyl alcohol. However, other organic solvents including the chlorinated aromatic hydrocarbons, aromatic ketones, alkyl benzoates, nitropropane, cyclohexanone, as well as mixtures thereof and mixtures of other solvents such as combinations of diethyl succinate and diethyl phthalate, of benzyl alcohol or furfuryl alcohol and of benzyl alcohol and trichloroethylene and other similar solvents. Good results have been obtained by swab developing exposed plates with either benzyl alcohol alone or with a 75 percent to 25 percent mixture, by volume, of benzyl alcohol or other solvents such as methyl isoamyl ketone or xylene. Other development procedures include swabbing with an emulsion developer which includes such organic solvents as benzyl alcohol, 4-butyrolactone, pentanedione, etc., and water and emulsifiers; tray or spray development with chlorobenzene, 1,2-dichloroethane, or trichloroethylene. The development method employed will depend upon the particular formulation of the polymer, upon its viscosity, and upon the nature of any addenda which may be present in the coating.

The following examples are included for a further understanding of this invention.

EXAMPLE 1

18 6/10 grams (0.05 mole) of divanillal cyclohexanone and 1 gram of benzyltriethylammonium chloride are dissolved in a boiling solution of 6.1 grams (0.15 mole) of NaOH in 200 ml. distilled water. This solution is cooled to 20° C. in a 1-liter, three-necked flask chilled under running cold water and fitted with a stainless steel paddle stirrer, thermometer, dropping funnel, and nitrogen inlet tube. 100 ml. of dichloromethane is added and then with vigorous stirring a solution of 6.0 grams (0.06 mole) phosgene in 50 ml. of dichloromethane is added dropwise over 15 minutes. 3 minutes after addition of the last phosgene, a yellow polymer begins to separate. More sodium hydroxide solution is added to keep the pH about 12. 50 minutes after completing addition of the phosgene, the reaction is acidified with acetic acid. The polymer precipitates upon acidification. It is slurried twice in distilled water, filtered and dried. The bright yellow polymer is soluble upon heating in tetrachloroethane, hexamethyl phosphoramide, dimethyl sulfoxide, and cyclohexanone. It has an inherent viscosity of 0.31 in tetrachloroethane. When this polymer is coated as a 2 percent dope in tetrachloroethane on oxidized aluminum supports, dried, exposed for 1, 2 or 5 minutes to a GE Sunlamp at a distance of 8 inches and developed in tetrachloroethane, high-quality, ink receptive images are obtained.

EXAMPLE 2

A copolycarbonate is prepared from 0.76 grams (0.0025 mole) of 2,6-bis(4-hydroxybenzal) cyclohexanone and 10.83 grams (0.0475 mole) of Bisphenol A, and 6.5 grams of phosgene. The time of addition is 15 minutes and reaction time is 70 minutes. 12 grams (94 percent) of light yellow fibers, soluble in cyclohexanone, chloroform, and dichloromethane is obtained. With only 5 mole percent of the light-sensitive bisphenol present, this polymer gives a good ink receptive image when coated from tetrachloroethane on oxidized aluminum and exposed and developed as in Example 1.

EXAMPLE 3

A copolycarbonate is prepared from 11.1 grams (0.03 mole) of divanillal 4-methylcyclohexanone, 6.8 grams (0.03 mole) of Bisphenol A, and 8.0 grams of phosgene. The addition time is 12 minutes and reaction time 70 minutes. 15 8/10 grams (80 percent) of long yellow fibers having an inherent viscosity of 0.90 in chloroform is obtained. Coatings of this polymer from tetrachloroethane on oxidized aluminum supports give good ink receptive images when exposed for 1 or 2 minutes at a distance of 8 inches to a GE Sunlamp and developed in tetrachloroethane.

EXAMPLE 4

A copolyester of 10.6 grams (0.03 mole) of divanillal cyclopentanone, 6.8 grams (0.03 mole) of Bisphenol A, and 16.0 grams (0.071 mole) of azelayl chloride is prepared using 8 minutes' addition time and 130 minutes' reaction time. 14 2/10 grams (53 percent) of yellow fibers result having an inherent viscosity of 0.20 in chloroform and possessing excellent solubility in polar solvents, including trichloroethylene. When coated on aluminum from tetrachloroethane, a good ink receptive image is obtained with 2 minutes' exposure to an arc lamp.

EXAMPLE 5

A solution of 10.6 grams (0.03 mole) of divanillal cyclopentanone and 6.8 grams (0.03 mole) of Bisphenol A in 300 ml. of water containing 10 grams of sodium hydroxide and 1 gram of benzyltriethylammonium chloride is reacted in a two-phase system with 13.4 grams (0.08 mole) of chloromethylphosphonic dichloride in 300 ml. of methylene chloride. After 80 minutes, the reaction is stopped by the addition of acetic acid, and the polymer is precipitated in methanol. After reprecipitation from chloroform in ether, 12.9 grams (56 percent) of a fluffy yellow polymer is obtained. The polymer is coated on oxidized aluminum supports from tetrachloroethane, dried, and exposed and developed as in Example 1 to give a good quality ink receptive image.

EXAMPLE 6

By a procedure similar to that described above, 35.2 grams (0.10 mole) of divanillal cyclopentanone is reacted with 30 grams (0.13 mole) of neopentyl bischloroformate. The reaction is conducted at 3° to 10° C., the addition time being 17 minutes, the color change from wine-red to orange occurring at 30 minutes, and the total reaction time being 93 minutes. The catalyst used is 1 gram of tri-isoamylamine. The polymer, being readily soluble in the dichloromethane layer after acidification by acetic acid, is washed twice with distilled water, and the aqueous layer separated and discarded. The polymer is precipitated in 3 gallons of methanol, filtered, and vacuum dried to give 60.0 grams of bright yellow fibers having an inherent viscosity of 0.30 in chloroform. When coated on an oxidized aluminum support as a 2 percent dope in tetrachloroethane, dried, exposed for 2 minutes to a GE Sunlamp at a distance of 8 inches and developed in tetrachloroethane, this polymer gives a good ink receptive image.

EXAMPLE 7

A solution of 9.9 grams (0.028 mole) of disyringal cyclopentanone, 11.6 grams (0.028 mole) of divanillal cyclopentanone, and 10.0 grams (0.044 mole) of Bisphenol A in 400 ml. of distilled water containing 50 grams of 40 percent NaOH is reacted with 30 grams (0.130 mole) of neopentyl bischloroformate in a two-phase system (water:methylene chloride) catalyzed by one-half gram of tri-isoamylamine. This reaction gave 47 grams of bright orange fibers with a viscosity of 0.57 in chloroform. When coated, exposed for two and four minutes and developed as described in Example 1, good ink receptive images are obtained.

EXAMPLE 8

A solution of 14.2 grams (0.040 mole) of divanillal cyclopentanone 4.8 grams (0.016 mole) of vanillalazine, and 10.0 grams (0.044 mole) of Bisphenol A in 500 ml. of distilled water containing 50 grams of 40 percent NaOH is reacted with 30 grams (0.130 mole) of neopentyl bischloroformate in a two-phase system (water:methylene chloride) catalyzed by 1 gram of tri-isoamylamine. The resulting 45.8 grams of light yellow fibers has a viscosity of 0.36 in tetrachloroethane. Good ink receptive images are obtained when coatings of this polymer from tetrachloroethane are exposed for 2 minutes to a GE Sunlamp and developed in tetrachloroethane.

EXAMPLE 9

A polycarbonate is prepared as described above by interfacial polycondensation of divanillal cyclopentanone (56 mole percent), tetrachloro Bisphenol A (44 mole percent), and nonamethylene bischloroformate. The polycarbonate has an inherent viscosity of 0.51 in 1:1 phenol:chlorobenzene. A 4 percent by weight solution of the polycarbonate in 1,2-dichloroethane is whirl-coated at 100 r.p.m. on a 5-mil thick grained, anodized, and subbed aluminum plate, and the plate is whirled until dry. The plate is exposed under a line and half-tone negative transparency at a machine setting of 70 units on a Nu-Arc Flip-Top Platemaker exposing device, Model FT-26L, having an X20-CN-10 xenon lamp. The exposed plate is then swab developed with benzyl alcohol, then with water, then with an acidic desensitizing etch, and finally it is rubbed up with a greasy lithographic ink to produce an excellent negative-working lithographic printing plate capable of press runs in excess of 50,000 copies.

EXAMPLE 10

A 1 percent solution in monochlorobenzene of a light-sensitive polycarbonate prepared by the interfacial polycondensation of divanillal cyclopentanone (56 mole percent), tetrachloro Bisphenol A (44 mole percent) and neopentyl bischloroformate is whirl coated under subdued light on chemically deposited zinc on Alcoa aluminum No. 3003 H19 at 50 r.p.m. for 5 minutes at room conditions. The coating is dried for an additional 10 minutes at 40° to 46° C. The coating is exposed imagewise to a 95-amp carbon arc at a distance of 5 feet for approximately one-half minute. The plate is swab developed with a formulation prepared as follows:

| | |
|---|---|
| Etch A | |
| Desensitizing Etch B: | 75.0 cc. |
| Water | 250.0 cc. |
| Glycerin | 250.0 cc. |
| Trisodium phosphate | 25.0 g. |
| Phosphoric acid to a pH of | 4.0 |
| 2-Methoxyethyl acetate | 25.0 cc. |
| Ethyl alcohol | 25.0 cc. |
| Cab-O-Sil | 10.0 g. |

Cab-O-Sil is a registered trademark of G. L. Cabot, Inc. for a colloidal silica thickening and gelling agent. The plate then swabbed with Etch B containing the following:

| | |
|---|---|
| Etch B | |
| Water | 250.0 cc. |
| Glycerin | 250.0 cc. |
| Trisodium phosphate | 25.0 g. |
| Phosphoric acid to a pH of | 4.0 |

and with an application of a commercially available lacquer. The excess lacquer is removed with Etch B. One thousand impressions are made using a lithographic press with little or no image loss.

EXAMPLE 11

A 2 percent solution in monochlorobenzene of a light-sensitive polycarbonate prepared by the interfacial copolycondensation of divanillal cyclopentanone (56 mole percent), Bisphenol A (44 mole percent) and neopentyl bichloroformate is flow coated on a commercially available plastic-coated paper lithoplate and dried in a vertical position at 40° C. The plate is exposed imagewise for 40 seconds to a 95-amp carbon arc at a distance of 5 feet. The exposed plate is swab developed with the solution used for Example 10 and then treated with swabbing using Etch B. The image is made visible by hand inking with a lithographic greasy ink. The excess ink is removed by swabbing with Etch B. One thousand impressions are made using a lithographic printing press.

EXAMPLE 12

A solution is prepared containing:

| | |
|---|---|
| Polycarbonate of Example 10 | 2.0 g. |
| Monochlorobenzene | 100.0 cc. |

The solution is diluted 1:1 with acetone for flow coating on a polyethylene-coated paper support. The polymer coverage is about 30–40 milligrams per square foot. The sheet is dried at about 40° C. for one-half hour. The support has over the polyethylene a hydrophilic layer comprising cross-linked polyvinyl alcohol containing colloidal silica. After drying, the coating is exposed to a negative for 12 seconds to a 95-amp carbon arc at a distance of 5 feet. The plate is swab processed using a solution of benzyl alcohol, followed by swabbing with water. It is then put on a lithographic printing press and 5,000 excellent quality prints are made. The developer can be modified by the addition of other solvents which either completely dissolve the unexposed polymer or are partial solvents, swelling solvents or nonsolvents for the polymer. A developer can be prepared by using 75 percent (volume) of benzyl alcohol and 25 percent (volume) of another solvent, such as methyl isoamyl ketone, xylene or ethyl alcohol.

EXAMPLE 13

Zinc plates are counteretched for 20 seconds in a mixture of 40 cc. hydrogen chloride per gallon of water prior to coating. The plates are rinsed with distilled water and air dried. A coating formulation is prepared as follows:

| | |
|---|---|
| Polycarbonate of Example 10 | 2.0 g. |
| Monochlorobenzene | 100.0 cc. |

The structure of the polymer is the same as that shown in Example 10 but of a higher molecular weight. The formulation is whirl coated at 60 r.p.m. on the zinc plate until the coating is completely dried. The coated plate is exposed imagewise for 50 units (1 unit — 0.86 second) to a 95-amp carbon arc at a distance of 5 feet. The unexposed areas are removed by swab developing with 2-methoxyethyl acetate. The developed plate is treated with Etch B and press impressions are obtained in the conventional manner. One thousand impressions are obtained with little or no wear.

EXAMPLE 14

Plates on paper support prepared as in Example 12 are incubated in unsealed bags for 8 days at 120° F. and 35 percent R.H. The plates maintained their same printing index speed and press performance as the fresh control coating. Tests on diazo paper plates subjected to the same storage conditions showed that such plates deteriorate so that they completely scum and are not usable.

EXAMPLE 15

The paper plate of our invention is prepared in large sizes for use on printing presses requiring larger than the 10- by 15-inch plates used in duplicator machines. A paper plate 19¾ by 23 inches is prepared using the same solutions as in Example 12. The plate is run for 1,000 impressions on a lithographic offset press.

EXAMPLE 16

The following formulation is prepared:

| | |
|---|---|
| Polycarbonate of Example 10 | 2.0 g. |
| Monochlorobenzene | 100.0 cc. |

The formulation if flow coated on a paper support (10×15 inches) of Example 11 and dried in a vertical position at 40° C. for one-half hour. The plate is exposed imagewise for about 1½ minutes to a 95-amp carbon arc at a distance of 5 feet. The exposed plate is swab developed with benzyl alcohol, followed by swabbing with water. High-quality copies are obtained using a lithographic printing press.

EXAMPLE 17

To 740 ml. of water is added 10 ml. (18.3 grams) of 85 percent phosphoric acid (0.1588 mole) and 30 ml. (33 grams) of 28 percent hydrogen peroxide (0.262 mole). Then with good agitation 10 ml. (9.55 grams) of tetraisopropyl titanate (0.0336 mole) is added. The result is an orange-yellow solution which is ready for coating. This solution is coated on polyethylene coated kraft paper to give a thin coating on the surface of the support, and then coated with the polycarbonate coating of Example 10. Good prints are obtained by printing as in Example 10.

EXAMPLE 18

A sheet of brush-grained aluminum having a thickness of 5 mils is immersed in a solution of titanium complex prepared by agitating vigorously a solution of 750 ml. of distilled water in 50 ml. of 31.9 percent fluosilicic acid, while 10 ml. of tetraisopropyl titanate is added rapidly in a fine stream. The aluminum is then passed between two mechanically driven three-fourth inch diameter rubber rolls under sufficient pressure to remove the excess solution. A very thin film of solution is thus obtained which dried rapidly at room temperature. The film is then overcoated with the light-sensitive polycarbonate of Example 10, processed and used for printing as in Example 10 with good results.

The invention has been described in detail with particular reference to preferred embodiments thereof, but it will be understood that variations and modifications can be effected within the spirit and scope of the invention.

What is claimed is:

1. A photosensitive element which comprises a support having thereon a light-sensitive coating comprising a light-sensitive linear film-forming polyester containing recurring units derived from at least one reactive acid dichloride and recurring units derived from at least one bisphenol, at least 5 mole percent of the bisphenol units containing the styryl ketone group.

2. A photosensitive element as defined in claim 1, wherein the reactive acid dichloride is selected from the group consisting of a. phosgene, b. bischloroformates of diols, c. diacid chlorides of aliphatic, alicyclic and aromatic dicarboxylic acids, d. diacid chlorides of phosphorous containing acids and e. diacid chlorides of sulfur-containing acids, and the bisphenol containing the styryl ketone group is selected from the group consisting of
a. dihydroxy chalcones,
b. dihydroxy dibenzal ketones.

3. A photosensitive element which comprises a support having thereon a light-sensitive coating comprising a light-sensitive linear film-forming polyester containing recurring units derived from at least one reactive acid dichloride selected from the group consisting of
a. bischloroformates of diols,
b. diacid chlorides of aliphatic, alicyclic and aromatic dicarboxylic acids,
c. diacid chlorides of phosphorous containing acids and
d. diacid chlorides of sulfur-containing acids, and recurring units derived from at least one bisphenol, at least 5 mole percent of the bisphenol units containing the styryl ketone group.

4. A photosensitive element as defined in claim 3 wherein the bisphenol containing the styryl ketone group is selected from the group consisting of
a. dihydroxy chalcones and
b. dihydroxy dibenzal ketones.

5. A photosensitive element as defined in claim 4, wherein the support is selected from the group consisting of
a. metal supports,
b. paper supports and
c. polymeric film supports.

6. A photosensitive element as defined in claim 4, wherein the acid dichloride is a diacid chloride selected from the group consisting of
fumaryl chloride,
glutaryl chloride,
azelayl chloride,
phthaloyl chloride and
1,4-cyclohexane dicarbonyl chloride.

7. A photosensitive element as defined in claim 4, wherein the acid dichloride is a bischloroformate having the structural formula:

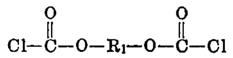

wherein $R_1$ is an alkylene group of one to 12 carbon atoms.

8. A photosensitive element as defined in claim 4, wherein the polyester additionally contains units derived from a non-light-sensitive bisphenol selected from the group consisting of
alizarin,
quinizarin,
4,4'-dihydroxydiphenyl sulfone,
Bisphenol A and
tetrahalogenated derivatives of Bisphenol A.

9. A photosensitive element as defined in claim 4, wherein the bisphenol containing the styryl ketone group is selected from the group consisting of
divanillal acetone
divanillal cyclopentanone,
divanillal cyclohexanone,
divanillal 4-methylcyclohexanone and
2,6-bis(hydroxybenzal)cyclohexanone.

10. A photosensitive element which comprises a support having thereon a light-sensitive coating comprising a light-sensitive linear film-forming polycarbonate having the following recurring structural units in the polymer backbone:

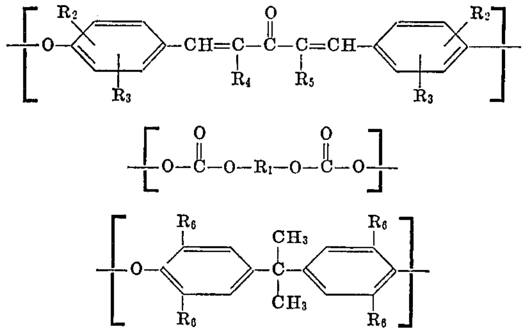

wherein $R_1$ is an alkylene group of one to 12 carbon atoms, $R_2$ and $R_3$ are each selected from the group consisting of hydrogen atoms and methoxy groups, $R_4$ and $R_5$ are each a hydrogen atom or together the hydrocarbon group necessary to complete a saturated ring of five to six carbon atoms, and $R_6$ is selected from the group consisting of hydrogen, chlorine and bromine atoms.

11. A photosensitive element as defined in claim 10, wherein the support is aluminum.

12. A photosensitive element as defined in claim 10, wherein the support is paper.

13. A photosensitive element as defined in claim 12, wherein the support is paper coated with a layer of a hydrophilic polymer.

14. A photosensitive element as defined in claim 10, wherein $R_1$ is a neopentylene group,
$R_4$ and $R_5$ together are an ethylene group and
$R_6$ are chlorine atoms.

15. A photosensitive element as defined in claim 10, wherein
$R_1$ is a neopentylene group,
$R_4$ and $R_5$ together are a propylene group and
$R_6$ are hydrogen atoms.

16. A photosensitive element which comprises a paper support having thereon a light-sensitive coating comprising a linear film-forming polycarbonate-containing units derived form divanillal cyclopentanone, neopentyl bischloroformate and tetrachloro Bisphenol A.

17. A process for preparing a polymeric image which comprises imagewise exposing to actinic radiation a photosensitive element comprising a support having thereon a light-sensitive coating comprising a light-sensitive linear film-forming polyester containing recurring units derived from at least one reactive acid dichloride and at least one bisphenol, at least 5 mole percent being a bisphenol selected from the group consisting of dihydroxy chalcones and dihydroxy dibenzal ketones, to insolubilize the coating in exposed areas, and developing an image on the element by removing the unexposed areas of the coating with a solvent therefor.

18. A process as defined in claim 17, wherein the acid dichloride is a bischloroformate of a diol, at least 5 mole percent of the bisphenol is a dihydroxy dibenzal ketone and remaining bisphenol is selected from the group consisting of Bisphenol A and its tetrahalogenated derivatives.

* * * * *